(12) United States Patent
Van Gompel et al.

(10) Patent No.: US 11,551,917 B2
(45) Date of Patent: Jan. 10, 2023

(54) REDUCTION OF BR$_2$ AND CL$_2$ IN SEMICONDUCTOR PROCESSES

(71) Applicant: Applied Materials, Inc., Santa Clara, CA (US)

(72) Inventors: Joseph A. Van Gompel, Austin, TX (US); James L'Heureux, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/793,983

(22) Filed: Feb. 18, 2020

(65) Prior Publication Data

US 2020/0273682 A1 Aug. 27, 2020

Related U.S. Application Data

(60) Provisional application No. 62/840,345, filed on Apr. 29, 2019, provisional application No. 62/808,943, filed on Feb. 22, 2019.

(51) Int. Cl.
*H01L 21/3065* (2006.01)
*H01J 37/32* (2006.01)

(52) U.S. Cl.
CPC ...... *H01J 37/32844* (2013.01); *H01J 37/321* (2013.01); *H01J 37/3244* (2013.01)

(58) Field of Classification Search
CPC ........................ H01L 21/3065; H01J 37/32844
See application file for complete search history.

(56) References Cited

U.S. PATENT DOCUMENTS

| 6,361,706 B1 | 3/2002 | Gabriel |
| 6,888,040 B1 * | 5/2005 | Shufflebotham ....... B01D 53/70 |
| | | 423/240 R |

(Continued)

FOREIGN PATENT DOCUMENTS

WO    2011-068936 A2    6/2011

OTHER PUBLICATIONS

International Search Report dated Jun. 11, 2020 for Application No. PCT/US2020/018665.

*Primary Examiner* — Thomas T Pham
(74) *Attorney, Agent, or Firm* — Patterson + Sheridan, LLP

(57) ABSTRACT

One or more embodiments described herein relate to abatement systems for reducing Br$_2$ and Cl$_2$ in semiconductor processes. In embodiments described herein, semiconductor etch processes are performed within process chambers. Thereafter, fluorinated greenhouse gases (F-GHGs), HBr, and Cl$_2$ gases exit the process chamber and enter a plasma reactor. Reagent gases are delivered from a reagent gas delivery apparatus to the plasma reactor to mix with the process gases. Radio frequency (RF) power is applied to the plasma reactor, which adds energy and "excites" the gases within the process chamber. When HBr is energized, it forms Br$_2$. Br$_2$ and Cl$_2$ are corrosive and toxic. However, the addition of H$_2$O in the plasma reactor quenches the Br$_2$ and Cl$_2$ emissions, as the H atoms recombine with the Br atoms and the Cl atoms to form HBr and HCl. HBr and HCl are readily water-soluble and removed through a wet scrubber.

20 Claims, 2 Drawing Sheets

(56) References Cited

U.S. PATENT DOCUMENTS

| | | |
|---|---|---|
| 2008/0102011 A1 | 5/2008 | Moalem et al. |
| 2010/0258510 A1 | 10/2010 | Hooshdaran et al. |
| 2011/0023908 A1 | 2/2011 | Neuber et al. |
| 2012/0309192 A1* | 12/2012 | Wang ................ H01L 29/66621 |
| | | 438/669 |
| 2013/0119444 A1* | 5/2013 | Cheng ............... H01L 21/30604 |
| | | 257/E21.409 |
| 2015/0255256 A1 | 9/2015 | Cox et al. |
| 2016/0077508 A1 | 3/2016 | Schauer |
| 2016/0166868 A1* | 6/2016 | Dickinson ......... H01J 37/32844 |
| | | 588/313 |
| 2018/0226234 A1 | 8/2018 | Dickinson |
| 2018/0318758 A1 | 11/2018 | Cox et al. |

\* cited by examiner

REDUCTION OF BR$_2$ AND CL$_2$ IN SEMICONDUCTOR PROCESSES

CROSS-REFERENCE TO RELATED APPLICATIONS

This application claims priority to U.S. Provisional Patent Application No. 62/840,345, filed Apr. 29, 2019, and to U.S. Provisional Patent Application No. 62/808,943, filed Feb. 22, 2019. Both applications are herein incorporated by reference in their entirety.

BACKGROUND

Field

One or more embodiments described herein generally relate to abatement systems for semiconductor processes, and more particularly, to abatement systems for reducing $Br_2$ and $Cl_2$ in semiconductor processes.

DESCRIPTION OF THE RELATED ART

Process gases used by semiconductor processing facilities include many compounds that must be abated or treated before disposal, due to regulatory requirements and environmental concerns. For example, etch processes, among others, often use fluorinated greenhouse gases (F-GHGs) such as $CF_4$, $SF_6$, $C_4F_8$, and $CHF_3$. Along with F-GHGs, other process gases such as HBr and $Cl_2$ are often used to improve selectivity and reduce oxidative damage to substrate surfaces during etch processes. Under energetic conditions, HBr is known to equilibrate with $H_2+Br_2$.

Process chamber plasmas are energetic enough to result in $Br_2$ formation. Conventional abatement systems are also energetic enough to result in $Br_2$ formation. $Br_2$ and $Cl_2$ are corrosive and toxic, causing environment concerns. $Br_2$ is liquid at room temperature and may accumulate in the exhaust duct under certain conditions. Additionally, $Br_2$ and $Cl_2$ are not water soluble and may not be completely abated in wet scrubbers. As HBr and $Cl_2$ flows increase in etch processes due to larger substrates being used in semiconductor processes, increasing $Br_2$ and $Cl_2$ emissions are problematic.

Accordingly, there is a need for abatement systems that reduce $Br_2$ and $Cl_2$ in semiconductor processes.

SUMMARY

One or more embodiments described herein relate to methods for abating process gases.

In one embodiment, a method for abating process gases includes performing a semiconductor etch process within a process chamber using process gases including fluorinated greenhouse gases (F-GHGs), HBr, and $Cl_2$, wherein the process gases are configured to flow out of the process chamber into a plasma reactor; introducing reagent gases from a reagent gas delivery system to the plasma reactor to react with the process gases; and applying RF power to the plasma reactor; wherein a ratio of a reagent gas flow rate to a HBr flow rate is greater than 2:1.

In another embodiment, a method for abating process gases includes performing a semiconductor etch process within a process chamber using process gases including fluorinated greenhouse gases (F-GHGs), HBr, and $Cl_2$ wherein the process gases are configured to flow out of the process chamber into a plasma reactor; introducing reagent gases from a reagent gas delivery system to the plasma reactor to react with the process gases; and applying RF power to the plasma reactor; wherein a ratio of a reagent gas flow rate to a $Br_2$ byproduct gas is greater than 8:1.

One of more embodiments described related to systems for abating process gases.

In one embodiment, a process system includes a process chamber; a plasma reactor located downstream of the process chamber; a reagent gas delivery apparatus located between the process chamber and the plasma reactor; a vacuum pump located downstream of the plasma reactor; a wet scrubber located downstream of the vacuum pump; an inert gas delivery apparatus located between the plasma reactor and the vacuum pump; and a controller configured to receive information from the process system, and when executed by a processor performs an operation, including: performing a semiconductor etch process within the process chamber using process gases including fluorinated greenhouse gases (F-GHGs), HBr, and $Cl_2$, wherein the process gases are configured to flow out of the process chamber into the plasma reactor; introducing water vapor ($H_2O$) from the reagent gas delivery system to the plasma reactor to react with the process gases; and applying RF power to the plasma reactor; wherein a ratio of a $H_2O$ flow rate to a HBr flow rate is greater than 2:1; and a ratio a $H_2O$ flow rate to a bromine ($Br_2$) byproduct gas is greater than 15:1.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
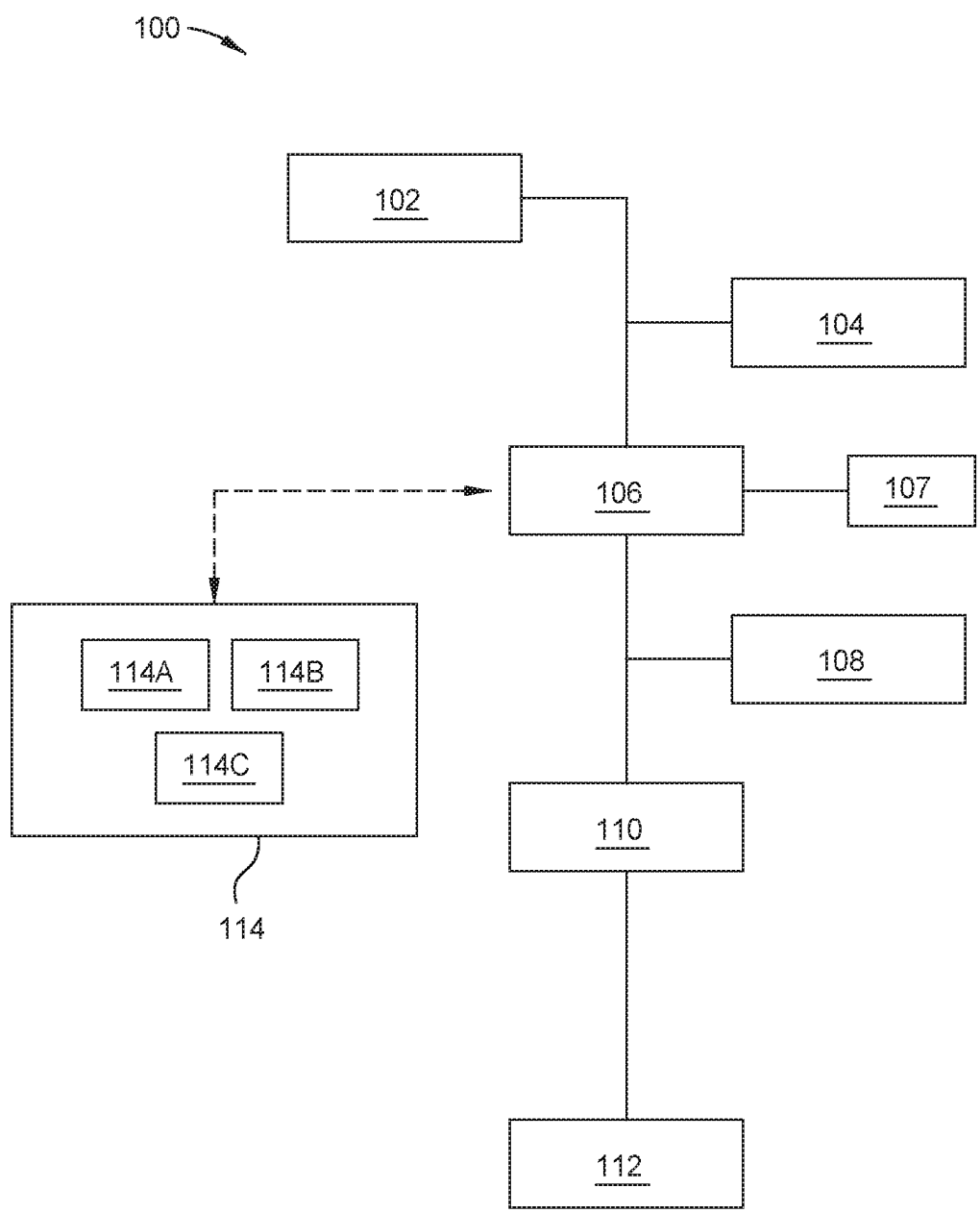
FIG. 1 is a schematic view of a process system according to at least one embodiment described herein.

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

One or more embodiments described herein relate to abatement systems for reducing $Br_2$ and $Cl_2$ in semiconductor processes. In embodiments described herein, semiconductor processes are performed within process chambers. During certain semiconductor processes, such as etch processes, F-GHGs, such as at least one of $CF_4$, $SF_6$, $C_4F_8$, and/or $CHF_3$ are often used. Along with the F-GHGs, other process gases such as HBr and $Cl_2$ are often used to improve selectivity and reduce oxidative damage to substrate surfaces during etch processes. Following the etch processes, the F-GHGs, HBr, and $Cl_2$ gases exit the process chamber and enter a plasma reactor.

In some embodiments, reagent gases, which include hydrogen and oxygen atoms, are delivered from a reagent gas delivery apparatus to the plasma reactor to mix with the process gases. Radio frequency (RF) power is applied to the plasma reactor, which adds energy and "excites" the gases within the plasma reactor. When the gases within the plasma reactor get excited, the gases dissociate to the atomic level. Thereafter, the atomic elements recombine to form more stable, water soluble compounds which helps greatly reduce or eliminate the F-GHGs which often cause environmental concerns if they exit to the environment. When HBr is energized within the process chamber and the plasma reactor, it is known to equilibrate with $H_2+Br_2$. As discussed above, $Br_2$ is corrosive and toxic. Additionally, $Cl_2$ is corrosive and toxic. However, the addition of $H_2O$ in the plasma reactor quenches the $Br_2$ and $Cl_2$ emissions, as the H atoms recombine with the Br atoms and the Cl atoms to form HBr and HCl. HBr and HCl are readily water-soluble and removed through a wet scrubber, whereas $Br_2$ and $Cl_2$ are not effectively abated in a wet scrubber.

As such, the embodiments described herein provide advantages over conventional abatement systems. In conventional abatement systems, H atoms do not recombine as effectively to form HBr and HCl, often leaving high amounts of toxic $Br_2$ and $Cl_2$, which are not abated through the wet scrubber. Additionally, in conventional abatement systems, $Br_2$ is liquid at room temperature and may accumulate in the exhaust duct of the process system under certain conditions. In the embodiments described herein, $Br_2$ and $Cl_2$ are converted to water-soluble HBr and HCl, respectively, and the problems above are reduced or eliminated. Additionally, the F-GHGs are greatly reduced and/or eliminated.

FIG. 1 is a schematic view of a process system 100 according to at least one embodiment described herein. The process system 100 includes a process chamber 102. The process chamber 102 is configured to perform semiconductor etch processes to process a substrate. In some embodiments, the process chamber 102 may be a plasma enhanced chemical vapor deposition (PECVD) chamber configured to perform process material deposition or etching. However, other chambers can also be used and modified with the embodiments described herein. During the etch processes, potentially damaging F-GHGs such as $CF_4$, $SF_6$, $C_4F_8$, and/or $CHF_3$ are often used with the process chamber 102. The F-GHGs gases are used to achieve the required anisotropy required in etch processes, especially for deep trench etch processes. Along with the F-GHGs, other process gases such as HBr and $Cl_2$ are often used to improve selectivity and reduce oxidative damage to substrate surfaces during etch processes.

Following the etch processes, the F-GHGs, HBr, and $Cl_2$ gases are configured to flow out of the process chamber 102 and enter a plasma reactor 106. The plasma reactor 106 is located downstream of the process chamber 102. RF power is applied to the plasma reactor 106 via a remote plasma source 107. The plasma source 107 can be an inductively coupled plasma source and may include a solid state match network. In some embodiments, the amount of RF power applied may be between about 2000 and about 4000 watts, although other amounts of RF power are also possible. The process system 100 also includes a reagent gas delivery apparatus 104 configured to deliver reagent gases, such as water vapor ($H_2O$), $H_2$, and/or $O_2$, to the plasma reactor 106 to mix with the process gases exiting the process chamber 102. In some embodiments, the reagent gas delivery apparatus 104 may be a water delivery system configured to introduce water vapor to supply hydrogen and oxygen atoms to the plasma.

The amount of each of the process gases within the plasma reactor 106 varies, and ratios of each of the different gases within the plasma reactor 106 can vary. In some embodiments, the ratio of the $H_2O$ vapor flow rate to the HBr chamber flow rate is greater than 2:1. In other embodiments, the ratio of the $H_2O$ vapor flow rate to the HBr chamber flow rate is greater than 5:1. In some embodiments, the ratio of the $H_2O$ vapor flow rate to $Br_2$ byproduct gas is greater than 8:1. In other embodiments, the ratio of the $H_2O$ vapor flow rate to $Br_2$ byproduct gas is greater than 15:1. In some embodiments, there can be higher amounts of $H_2O$ than F-GHGs gases, and vice versa. In other embodiments, there can be higher amounts of $H_2$ and/or $O_2$ than F-GHGs gases, and vice versa. In other embodiments, there can be substantially similar amounts of some or all of the gases within the plasma reactor 106.

Water vapor supplied from the reagent gas delivery apparatus 104 mixes with the process gases exiting the process chamber 102 within the plasma reactor 106. The plasma source 107 adds energy, which dissociates the process gases to the atomic level. Thereafter, the atomic elements recombine with the water vapor to form more stable, water soluble compounds which helps greatly reduce or eliminate the F-GHGs which often cause environmental concerns if they exit to the environment. When HBr is energized within the process chamber and the plasma reactor, it is known to equilibrate with $H_2+Br_2$. As discussed above, $Br_2$ is corrosive and toxic. Additionally, $Cl_2$ is corrosive and toxic. However, the addition of $H_2O$ in the plasma reactor 107 quenches the $Br_2$ and $Cl_2$ emissions, as the H atoms recombine with the Br atoms and the Cl atoms to form HBr and HCl. HBr and HCl provide an advantage over conventional abatement systems, in which H atoms do not recombine as effectively to form HBr and HCl, often leaving high amounts of toxic $Br_2$ and $Cl_2$. Additionally, in conventional abatement systems, $Br_2$ is liquid at room temperature and may accumulate in the exhaust duct of the process system 100 under certain conditions.

In some embodiments, the process system 100 includes an inert gas delivery apparatus 108 located downstream of the plasma reactor 106. Inert gases can be delivered to the process system 100 via the inert gas delivery apparatus 108. Furthermore, a vacuum pump 110 is located downstream of the inert gas delivery apparatus 108. Therefore, the inert gas delivery apparatus 108 is located between the plasma reactor 106 and the vacuum pump 110. The vacuum pump 110 may be used to pump the gases exiting the plasma reactor 106 and the inert gas delivery apparatus 108 to a wet scrubber 112. The wet scrubber 112 is located downstream of the vacuum pump 110. In some embodiments, the wet scrubber 112 may be a bubble tower, packed bed tower, or scrubbing tower. Any suitable wet scrubber may be used. The wet scrubber 112 acts to abate the remaining gases in the process system 100 before they exit into the environment. The wet scrubber 112 does not abate $Br_2$ and $Cl_2$ well, as they are not water soluble. However, the wet scrubber 112 does abate HBr and HCl well, as they are water soluble. Therefore, the embodiments described herein provide the advantage of converting $Br_2$ and $Cl_2$, HBr and HCl, such that they can be more easily abated by the wet scrubber 112 before exiting into the environment.

In some embodiments, the process system 100 is controlled by a controller 114. The controller 114 is in communication with hardware contained within the entire process system 100, which acts to control the process parameters within the process system 100. The controller 114 may include a central processing unit (CPU) 114A, memory 114B, and support circuits (or I/O) 114C. The CPU 114A may be one of any form of computer processors that are used in industrial settings for controlling various processes and hardware and monitor the processes. The memory 114B is connected to the CPU 114A, and may be one or more of a readily available memory, such as random access memory (RAM), read only memory (ROM), floppy disk, hard disk, or any other form of digital storage, local or remote. Software instructions, algorithms and data can be coded and stored within the memory 114B for instructing the CPU 114A. The support circuits 114C are also connected to the CPU 114A for supporting the processor in a conventional manner. The support circuits 114C may include conventional cache, power supplies, clock circuits, input/output circuitry, subsystems, and the like. A program (or computer instructions) readable by the controller determines which tasks are performable within the process system 100. The program may be software readable by the controller 114 and may include code to monitor and control, the process parameters within the process system 100.

Figure 2:
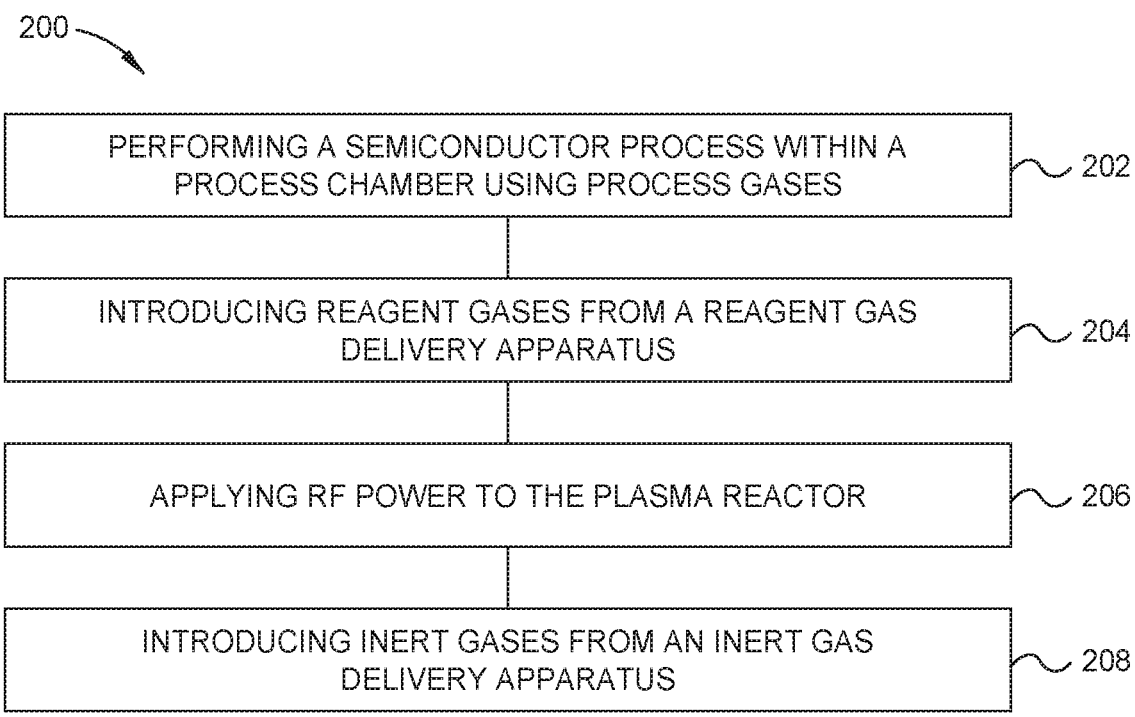
FIG. 2 is a flow chart of a method according to at least one embodiment described herein.

FIG. 2 is a flow chart of a method 200 according to at least one embodiment described herein. In these embodiments, the method 200 is performed with the devices described in FIG. 1, but is not limited to these devices and can be performed with other similar devices. In block 202, a semiconductor manufacturing process is performed within the process chamber 102. The semiconductor manufacturing process can be an etch process, in which F-GHGs such as $CF_4$, $SF_6$, $C_4F_8$, and/or $CHF_3$ are often used. Along with the F-GHGs, other process gases such as HBr and $Cl_2$ are often used to improve selectivity and reduce oxidative damage to substrate surfaces during etch processes.

In block 204, reagent gases are introduced to the plasma reactor 106 from a reagent gas delivery apparatus 104. The reagent gases mix with the process gases exiting the process chamber 102. In some embodiments, the reagent gas delivery apparatus 104 may be a water delivery system configured to introduce water to supply hydrogen and oxygen atoms to the plasma reactor 106.

As discussed above, the amount of each of the process gases within the plasma reactor 106 varies, and ratios of each of the different gases within the plasma reactor 106 can vary. In some embodiments, the ratio of the $H_2O$ vapor flow rate to the HBr chamber flow rate is greater than 2:1. In other embodiments, the ratio of the $H_2O$ vapor flow rate to the HBr chamber flow rate is greater than 5:1. In some embodiments, the ratio of the $H_2O$ vapor flow rate to $Br_2$ byproduct gas is greater than 8:1. In other embodiments, the ratio of the $H_2O$ vapor flow rate to $Br_2$ byproduct gas is greater than 15:1. In some embodiments, there can be higher amounts of $H_2O$ than F-GHGs gases, and vice versa. In other embodiments, there can be higher amounts of $H_2$ and/or $O_2$ than F-GHGs gases, and vice versa. Ratios of HBr and $Cl_2$ can also be compared with the other gases in the plasma reactor 106. For example, in some embodiments, the ratio of the $H_2O$ vapor flow rate to $Cl_2$ byproduct gas is greater than 8:1. In other embodiments, the ratio of the $H_2O$ vapor flow rate to $Cl_2$ byproduct gas is greater than 15:1. In other embodiments, there can be substantially similar amounts of some of all of the gases within the plasma reactor 106.

In block 206, RF power is applied to the plasma reactor 106. The RF power can be applied via a remote plasma source 107. In some embodiments, the amount of RF power applied may be about 2009 watts to about 4000 watts, although other amounts of RF power are also possible. In optional block 208, inert gases are delivered to the process system 100 via the inert gas delivery apparatus 108.

Embodiments described by method 200 provide advantageous results compared to conventional abatement processes. For example, after performing the method 200, the F-GHGs, such $CF_4$ and $SF_6$, are 95% abated. Additionally, $Br_2$ emissions are reduced from the process chamber 102 by about 30 to 40% compared to conventional processes and $Cl_2$ emissions are reduced from the process chamber 102 by about 90% compared to conventional processes. Therefore, lesser quantities of the damaging F-GHGs, $Br_2$, and $Cl_2$ gases exit the process system 100 when performing the method 200. Reducing these potentially harmful emissions becomes even more important as greater amounts of HBr and $Cl_2$ are used to etch larger substrates within the process chamber 102 during semiconductor processes.

While the foregoing is directed to implementations of the present invention, other and further implementations of the invention may be devised without departing from the basic scope thereof, and the scope thereof is determined by the claims that follow.

We claim:

1. A method for abating process gases, comprising:
performing a semiconductor etch process within a process chamber using process gases including fluorinated greenhouse gases (F-GHGs), HBr gas, and $Cl_2$ gas;
flowing the process gases out of the process chamber into a plasma reactor;
introducing reagent vapor from a reagent vapor delivery system to the plasma reactor to react with the process gases;
applying RF power to the plasma reactor converting the process gases at least partially to a $Br_2$ byproduct gas within the plasma reactor and reacting the $Br_2$ byproduct gas with the reagent vapor to form HBr, wherein a ratio of a reagent vapor flow rate to a HBr flow rate of the HBr gas to the process chamber is greater than 2:1; and
introducing an inert gas between the plasma reactor and a pump configured to pump gases exiting the plasma reactor.

2. The method of claim 1, wherein the ratio of the reagent vapor flow rate to the HBr flow rate is greater than 5:1.

3. The method of claim 1, wherein the reagent vapor includes water vapor ($H_2O$).

4. The method of claim 1, wherein the reagent vapor includes hydrogen (H) and oxygen (O) atoms.

5. The method of claim 4, wherein the amount of H and O atoms are greater than the amount of F-GHGs.

6. The method of claim 4, wherein the amount of F-GHGs are greater the amount of H and O atoms.

7. The method of claim 1, wherein the amount of RF power is between about 2000 Watts and about 4000 Watts.

8. The method of claim 1, wherein the F-GHGs include at least one of $CF_4$, $SF_6$, $C_4F_8$, or $CHF_3$.

9. The method of claim 1, further comprising pumping gases exiting the plasma reactor and the inert gas to a wet scrubber.

10. The method of claim 9, wherein the wet scrubber is selected from the group consisting of a bubble tower, packed bed tower, and a scrubbing tower.

11. A method for abating process gases, comprising:
performing a semiconductor etch process within a process chamber using process gases including fluorinated greenhouse gases (F-GHGs), HBr gas, and $Cl_2$ gas;

flowing the process gases from the process chamber into a plasma reactor;

introducing reagent vapor from a reagent vapor delivery system to the plasma reactor to react with the process gases, wherein the $Cl_2$ gas reacts with the reagent vapor to form HCl within the plasma reactor; and applying RF power to the plasma reactor converting the process gases at least partially to a $Br_2$ byproduct gas within the plasma reactor; and introducing an inert gas between the plasma reactor and a pump configured to pump gases exiting the plasma reactor.

12. The method of claim 11, wherein the ratio of the reagent vapor flow rate to the $Br_2$ byproduct gas is greater than 15:1.

13. The method of claim 11, wherein the reagent vapor includes water vapor $H_2O$.

14. The method of claim 11, wherein the reagent vapor includes hydrogen (H) and oxygen (O) atoms.

15. The method of claim 14, wherein the amount of H and O atoms are greater than the amount of F-GHGs.

16. The method of claim 14, wherein the amount of F-GHGs are greater the amount of H and O atoms.

17. The method of claim 11, wherein the amount of RF power is between about 2000 Watts and about 4000 Watts.

18. The method of claim 11, wherein the F-GHGs include at least one of $CF_4$, $SF_6$, $C_4F_8$, or $CHF_3$.

19. The method of claim 11, further comprising pumping gases exiting the plasma reactor to a wet scrubber.

20. The method of claim 19, wherein the wet scrubber is selected from the group consisting of a bubble tower, packed bed tower, and a scrubbing tower.

* * * * *